United States Patent [19]

Tsukamoto et al.

[11] Patent Number: 4,942,448
[45] Date of Patent: Jul. 17, 1990

[54] STRUCTURE FOR ISOLATING SEMICONDUCTOR COMPONENTS ON AN INTEGRATED CIRCUIT AND A METHOD OF MANUFACTURING THEREFOR

[75] Inventors: Katsuhiro Tsukamoto; Masahide Inuishi; Masahiro Shimizu, all of Hyogo, Japan

[73] Assignee: Mitsubishi Denki Kabushiki Kaisha, Tokyo, Japan

[21] Appl. No.: 262,303

[22] Filed: Oct. 25, 1988

[30] Foreign Application Priority Data

Nov. 17, 1987 [JP] Japan ................................ 62-291340

[51] Int. Cl.$^5$ ............................................. H01L 29/78
[52] U.S. Cl. ........................................ 357/49; 357/59; 357/42; 357/50
[58] Field of Search .................... 357/59 K, 59 G, 49, 357/50, 42

[56] References Cited

U.S. PATENT DOCUMENTS 4,151,631 5/1979 Klein ........................................ 357/41
4,737,831 4/1988 Iwai ......................................... 357/49
4,803,528 2/1989 Pankove ................................. 357/59

OTHER PUBLICATIONS

IEDM 82: "Isolation Technology for Scaled MOS VLSI", by W. G. Oldham, 9.1, 1982, pp. 216–219.
IEDM 82: "Deep Trench Isolated CMOS Devices", by R. D. Rung et al., 9.6, 1982, pp. 237–240.

Primary Examiner—Andrew J. James
Assistant Examiner—David Soltz
Attorney, Agent, or Firm—Lowe, Price, Leblanc, Becker & Shur

[57] ABSTRACT

A semiconductor apparatus having a region for isolation between devices comprises a semiconductor substrate, a polycrystalline silicon layer portions selectively formed to be spaced apart from each other on the semiconductor substrate, an impurity diffused region formed under the polycrystalline silicon layer, and a silicon oxide film for filling in a space between the respective adjacent portions of the polycrystalline silicon layer. The impurity diffused region constitutes a source or drain region of a field effect device such as a MOS transistor isolated by the silicon oxide film.

33 Claims, 12 Drawing Sheets

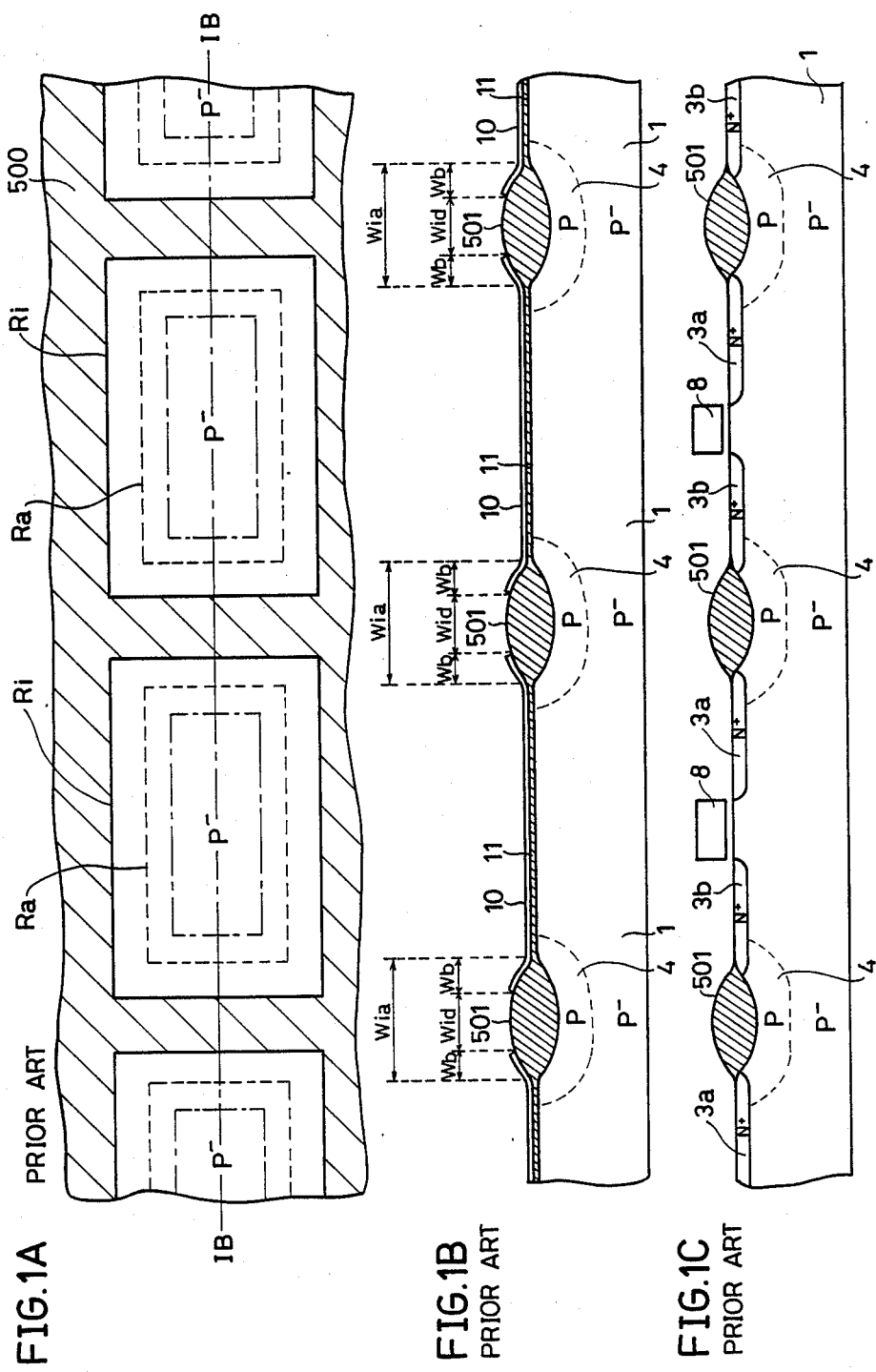

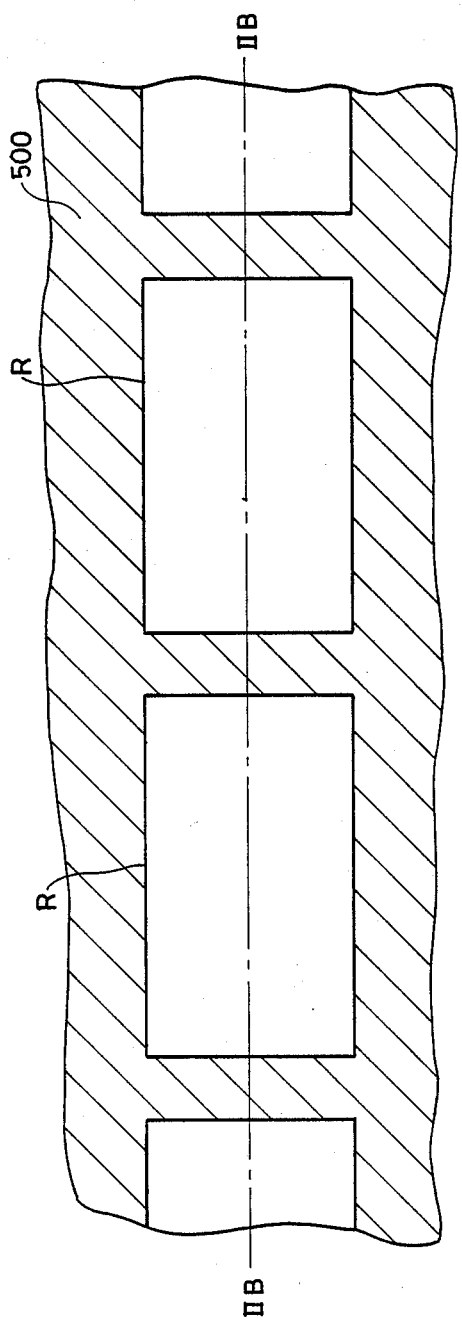
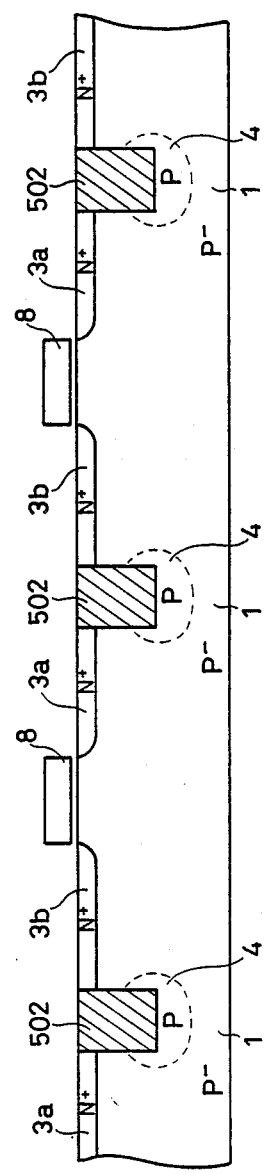
FIG.2A  PRIOR ART
FIG.2B  PRIOR ART

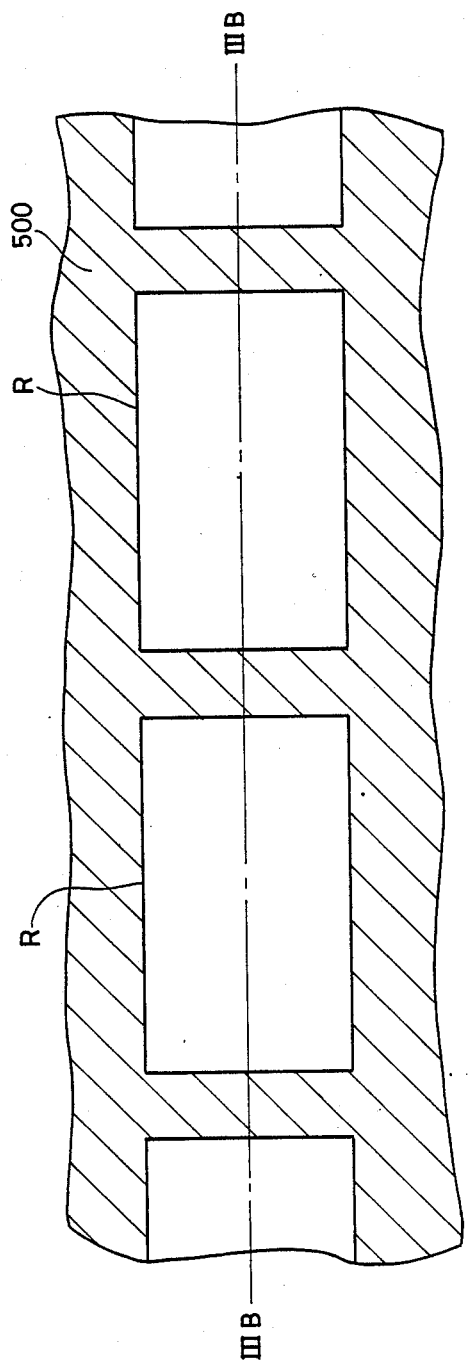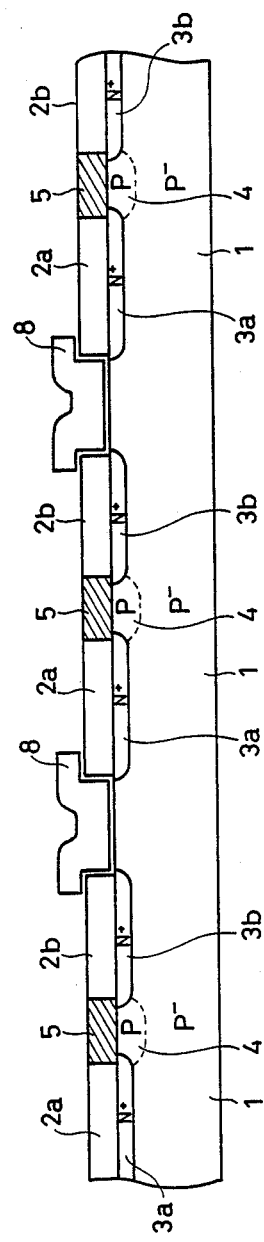
FIG.3A
FIG.3B

STRUCTURE FOR ISOLATING SEMICONDUCTOR COMPONENTS ON AN INTEGRATED CIRCUIT AND A METHOD OF MANUFACTURING THEREFOR

BACKGROUND OF THE INVENTION

1. Field of the Invention

The present invention relates generally to provide isolation between semiconductor components on an integrated circuit and, more particularly, to provide an isolation structure for a semiconductor integrated circuit device having high integrated density and a method of manufacturing therefor.

2. Description of the Prior Art

FIG. 1A is a partial plan view showing a designed isolation region 500 and a designed active region Ri on a silicon substrate. FIGS. 1B and 1C are partial sectional views showing a device isolation technique by a selective oxidation method, taken along the line IB—IB in FIG. 1A, (this technique being usually referred to as a LOCOS isolation method) which is described in "Isolation Technology for Scaled MOS VLSI" by W. G. Oldham, International Electron Devices Meeting, 1982, Technical Digest, pp. 216.

First, referring to the figures, in the LOCOS isolation method, a lower silicon oxide film 11 is formed by applying thermal oxidation to a silicon substrate 1. A silicon nitride film 10 having resistance to oxidation is deposited on the lower silicon oxide film 11 using a chemical vapor deposition and the like. The surface of the lower silicon oxide film 11 in a designed isolation region 500 is exposed by removing a portion of the silicon nitride film 10, using well-known photolithographic and etching processes. Boron (B+) is implanted and a channel stopper region 4 with high impurity concentration is formed in a portion of the silicon substrate 1 serving as the isolation region.

Referring to FIG. 1B, a thick field oxide film 501 is formed by applying selective thermal oxidation to the silicon substrate 1 which is masked by the silicon nitride film 10.

Referring to FIG. 1C, the silicon nitride film 10 and the lower silicon oxide film 11 are removed. A gate electrode 8 is formed through a gate oxide film on a portion serving as, for example, the channel region of the MOS transistor. N type impurity diffused regions 3a and 3b serving as the source region and the drain region, respectively, of the MOS transistor are formed. As a result, a region for isolation between devices is formed by forming the channel stopper region 4 of the same conductive type (p type in the figure) as that of the silicon substrate 1 under the field oxide film 501.

The LOCOS isolation method has been used extensively since 1970's as the device isolation technology for semiconductor integrated circuit devices. However, the following difficulties have been raised as devices have become fine and a dimension thereof has been decreased to approximately 1 μm.

(a) As shown in FIG. 1B, the field oxide film 501 makes encroachment under the silicon nitride film 10 (called bird's beaks) and a finished isolation width Wia is enlarged on both sides by Wb as compared with a designed isolation width Wid and, as a result, a portion of an active region that can be formed is reduced and it becomes difficult to form a fine device. Referring to FIG. 1A, the active region is reduced from a designed active region Ri to an actual active region Ra.

(b) As shown in FIG. 1C, because of a thermal treatment for the growth of the thick field oxide film 501, a p type impurity diffused region of the channel stopper region 4 is enlarged and a junction capacitance thereof with n type impurity diffused regions 3a and 3b is increased. In addition, in a MOS (Metal Oxide Semiconductor) transistor, a narrow channel effect in which a threshold voltage rises according to decrease of a channel width becomes noticeable.

(c) As shown in FIG. 1C, because the thick field oxide film 501 having a difference in level is formed in a region for isolation between devices, the surface of the isolation region becomes non-planar. This is inconvenient for formation of a fine pattern such as a wiring.

(d) Stress occurs between the thick field oxide film 501 and the silicon substrate 1 because of a thermal treatment for the growth of the thick field oxide film 501. This often brings about a crystalline defect such as stacking fault and the like in the silicon substrate 1.

In order to solve the above described difficulties, in place of the conventional LOCOS isolation method, a trench isolation technique is proposed which is described in "Deep Trench Isolated CMOS Devices" by R. D. Rung et al., International Electron Devices Meeting, 1982, Technical Digest, pp. 237. FIG. 2A is a partial plan view showing a designed isolation region 500 and an active region R on a silicon substrate. FIG. 2B is a partial sectional view showing a trench isolation structure, taken along the line IIB—IIB in FIG. 2A.

First, referring to the figures, in the trench isolation method, a trench is formed in a portion of the silicon substrate 1 serving as the isolation region by applying anisotropic etching such as reactive ion etching, using a pattern of a thick oxide film formed on the silicon substrate 1 as a mask. Boron (B+) is implanted in the trench, using the pattern of the thick oxide film as a mask and a channel stopper region 4 with high impurity concentration is formed in a portion of the silicon substrate 1 serving as the trench. A thin silicon oxide film is formed by applying thermal oxidation to the whole surface of the silicon substrate 1. An insulating material 502 such as silicon oxide is deposited over the whole surface such that the insulating material may fully fill in the trench, using the chemical vapor deposition method and the like. Then, a photoresist is provided over the whole surface. Dry etching is made with the condition enabling an etching rate of the photoresist and that of the insulating material 502 to be equal, until the surface of the insulating material 502 is on the same level with the surface of the silicon substrate 1. As a result, the insulating material 502 is embedded inside the trench and a region for isolation between devices is formed with trench structure. Then, after a gate electrode 8 is formed through a gate oxide film on a portion serving as, for example, the channel region of the MOS transistor, n type impurity diffused regions 3a and 3b serving as the source region and the drain region, respectively, of the MOS transistor are formed.

However, in the trench isolation, it is difficult to introduce an impurity to a vertical side wall of the trench by an ion implantation method widely used in general. As a result, a leakage current is liable to flow along the side wall of the trench. In addition, because of the concentration of an electric field around the corner portion of the trench, an effect of a parasitic MOS transistor is easily generated and therefore, the leakage current is also liable to flow. In case that the concentration of an electric field occurs in the corner portions of the edge of the channel region, a threshold voltage is also liable to be decreased. Furthermore, stress occurs due to a difference between a coefficient of thermal expansion of the insulating material 502 filled in the trench and that of the silicon substrate 1. This often brings about a crystalline defect in the silicon substrate 1. Still another disadvantage is that the process of forming the trench isolation comprises complex steps as described above.

Because of the above described disadvantages, the trench isolation method needs many technological improvements and at the present, it is not widely used in manufacturing semiconductor integrated circuit devices.

SUMMARY OF THE INVENTION

The present invention was made to solve the above described disadvantages.

One object of the invention is to improve isolation among semiconductor components on an integrated circuit.

Another object of the invention is to provide an isolation structure for isolating semiconductor components of an integrated circuit having a high integration density.

An addition object is to provide an isolation structure for isolating semiconductor components of an integrated circuit having a high integration density wherein electrical characteristics of the components are not altered.

A further object is to provide isolation between field effect devices on an integrated circuit without altering threshold voltage, breakdown voltage, leakage current and other characteristics.

Yet another object is to provide an isolation structure wherein mechanical stress caused by unequal thermal coefficients of expansion of the isolation structure is eliminated.

A further object of the invention is to provide component isolation in an integrated circuit using an isolation structure that is planar in configuration.

Yet another object is to provide a component isolation structure in an integrated circuit, wherein process steps for fabricating the structure are easily implemented.

Still another object of this invention is to provide component isolation in an integrated circuit wherein the surface areas of the active regions are maximized.

In a semiconductor apparatus in accordance with the present invention, polycrystalline silicon layer portions are selectively formed to be spaced apart from each other on a main surface of a semiconductor substrate. Semiconductor regions of a conductivity type opposite to that of impurity in the semiconductor substrate are formed under the polycrystalline silicon layer portions. An isolation region for isolating the above described semiconductor regions is formed by an insulating layer which is filled in a space between the respective adjacent polycrystalline silicon layer portions.

In a method of manufacturing a semiconductor apparatus in accordance with the present invention, a polycrystalline silicon layer is formed on a main surface of a semiconductor substrate, and then impurity of a conductivity type opposite to that of impurity in the semiconductor substrate is introduced into the polycrystalline silicon layer. Subsequently, the polycrystalline silicon layer is patterned so that the patterns may be spaced apart by selectively removing portions of the polycrystalline silicon layer, and then the insulating layer is filled between the patterns of the polycrystalline silicon layer. A semiconductor region is formed when the semiconductor substrate under the polycrystalline silicon layer is doped with the impurity introduced into the polycrystalline silicon layer.

In a preferred embodiment of the semiconductor apparatus, the insulating layer comprises at least a silicon oxide film, and a plurality of semiconductor devices are isolated from each other by this insulating layer. These semiconductor devices are field effect devices each including a semiconductor region formed under a polycrystalline silicon layer to constitute at least an electrode. In addition, an inversion preventing region is formed under the insulating layer.

According to the semiconductor apparatus of the present invention, the semiconductor region is formed under the polycrystalline silicon layer. The insulating layer for isolating devices is formed to fill a space between the respective adjacent portions of the polycrystalline silicon layer. Therefore, since the width of the region for isolation between devices is defined by selective formation of the polycrystalline silicon layer portions, the region for isolation between devices is not enlarged and it becomes possible to form the fine isolation region.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 1A, 1B and 1C are a partial plan view and partial sectional views showing a conventional LOCOS isolation method;

FIGS. 2A and 2B are a partial plan view and a partial sectional view showing a conventional trench isolation method;

FIGS. 3A and 3B are a partial plan view and a partial sectional view showing a semiconductor apparatus having a region for isolation between devices in accordance with one embodiment of the present invention;

DESCRIPTION OF THE PREFERRED EMBODIMENTS

Figure 4:
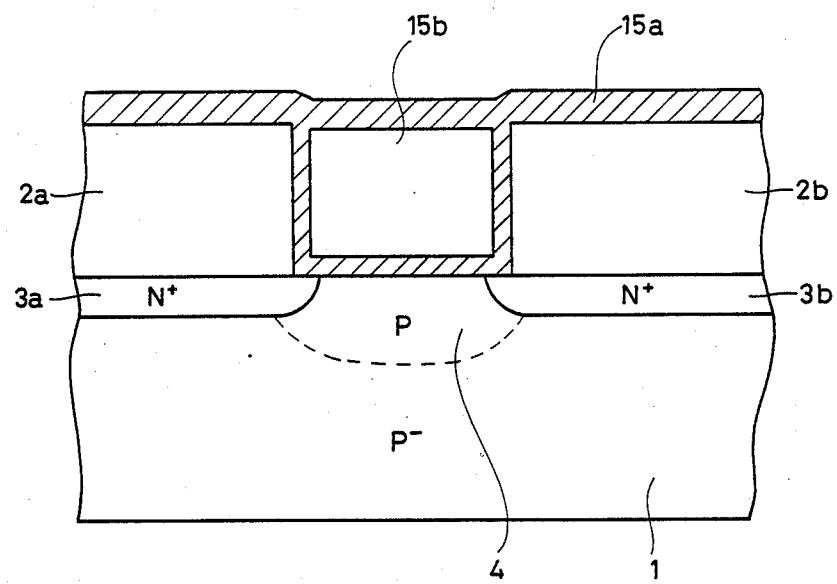
FIG. 4 is a partial sectional view showing a semiconductor apparatus having a region for isolation between devices in accordance with another embodiment of the present invention.

Referring to the figures, a description is made of one embodiment of the present invention. FIG. 3A is a partial plan view showing a designed isolation region 500 and an active region R on a silicon substrate. FIG. 3B is a partial sectional view showing a semiconductor apparatus having an isolation region for isolation between devices in accordance with the present invention, with particular attention to the region for isolation between-devices, taken along the line IIIB—IIIB. Referring to the figures, polycrystalline silicon layers 2a and 2b are selectively formed on a p type silicon substrate 1. N type impurity diffused regions 3a and 3b are formed in the silicon substrate 1 under the polycrystalline silicon layers 2a and 2b, respectively. Then n type impurity diffused regions 3a and 3b are regions serving as, for example, a source region or a drain region of the MOS transistor. An impurity having the same conductivity type as the silicon substrate 1 is implanted using the polycrystalline silicon layers 2a and 2b as a mask and a channel stopper region 4 is formed in a self-alignment manner with respect to the n type impurity diffused regions 3a and 3b. A silicon oxide film 5 is provided to fill in a space between the polycrystalline silicon layers 2a and 2b and the region 500 for isolation between devices having a very flat surface is formed.

FIG. 4 is a partial sectional view showing another embodiment of a semiconductor apparatus having a region for isolation between devices in accordance with the present invention. An embedded polycrystalline silicon layer 15b surrounded by an oxide film 15a is provided to fill in a space between the polycrystalline silicon layers 2a and 2b. The embedded polycrystalline silicon layer 15b is undoped and serves as insulator. Thus, an insulating layer may be formed of a composite film consisting of the oxide film 15a and the undoped polycrystalline silicon layer 15b.

Description is now made of a method of manufacturing a semiconductor apparatus in accordance with the present invention.

FIGS. 5A to 5H are partial sectional views showing a method of manufacturing a semiconductor apparatus in accordance with the present invention in the order of steps.

Figure 5A:
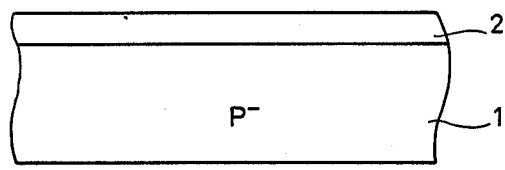
FIGS. 5A, 5B, 5C, 5D, 5E, 5F, 5G, 5H, 5I, 5J, 5K, 5L and 5M are partial sectional views showing a method of manufacturing a semiconductor apparatus in accordance with one and another embodiments of the present invention in the order of steps.

First, referring to FIG. 5A, a polycrystalline silicon layer 2 is deposited on a silicon substrate 1 (assuming that it has a p− conductivity type) using a chemical vapor deposition and the like. At this time, the polycrystalline silicon layer 2 is approximately 100 to 500 nm in thickness.

Figure 5B:
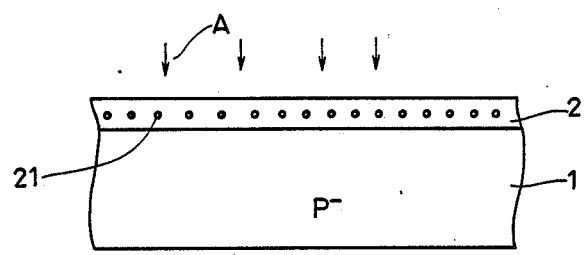

Referring to FIG. 5B, an n type impurity 21 is introduced into the polycrystalline silicon layer 2 in a direction shown by an arrow A and the ion implantation method and the like. At this time, the n type impurity 21 is prevented from entering the silicon substrate 1. $As^+$, $P^+$ and the like may be used as the impurity. Preferably, it is preferred that a large amount of $As^+$ and a small amount of $P^+$ are both implanted in order to lessen an influence of an electric field.

Figure 5C:
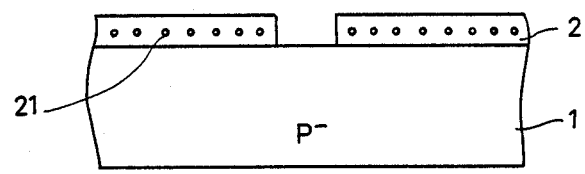

Referring to FIG. 5C, a pattern of the polycrystalline silicon layer 2 is formed by removing a portion of the polycrystalline silicon layer 2 to provide the isolation region, using well-known photolithographic and etching processes.

Figure 5D:
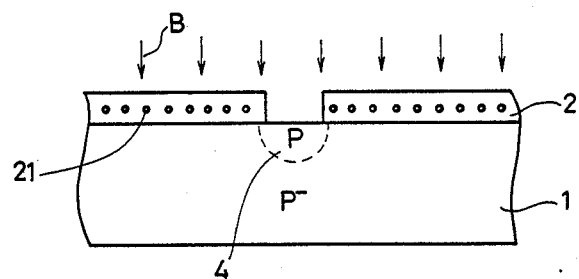

Referring to FIG. 5D, boron ($B^+$) is implanted in direction shown by an arrow B using the pattern of the polycrystalline silicon layer 2 as a mask. A channel stopper region 4 with high impurity concentration is formed in a portion of the silicon substrate 1 serving as the isolation region. At this time, if the polycrystalline silicon layer 2 is thin and it does not perform a masking function for the ion implantation of boron, it is needless to say that the ion implantation may be made, using a remaining photoresist which was used at the time of forming the pattern of the polycrystalline silicon layer 2 and not removed. Although the ion implantation dose of boron is determined in view of the film thickness of the field oxide film, it is usually approximately $1 \times 10^{12}$ to $3 \times 10^{13}/cm^2$.

Figure 5E:
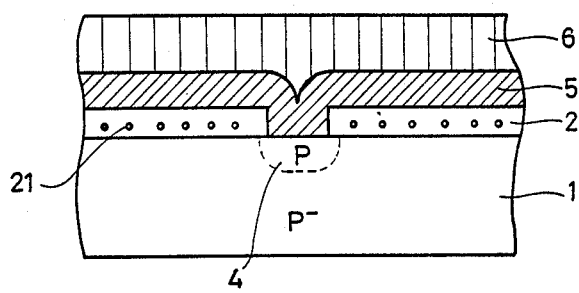

Referring to FIG. 5E, a silicon oxide film 5 is deposited over the whole surface of the silicon substrate 1 using the chemical vapor deposition method and the like. At this time, it is necessary to set a thickness of the silicon oxide film 5 to a value larger than that of the polycrystalline silicon layer 2 such that the silicon oxide film 5 may fill in the space between the polycrystalline silicon layer portions 2. Then, for example, a photoresist 6 is provided over the whole surface.

Figure 5F:
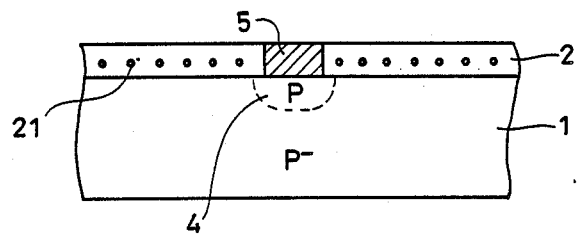

Referring to FIG. 5F, etching is made with the condition enabling an etching rate of the photoresist 6 and that of the silicon oxide film 5 to be equal, until the surfaces of the polycrystalline silicon layer portions 2 are exposed. As a result, the silicon oxide film 5 serving as the field oxide film is made flat to have an exposed surface on the same level as the exposed surfaces of the polycrystalline silicon layer portions 2. An isolation region having the channel stopper region 4 under the silicon oxide film 5 is formed.

Figure 5G:
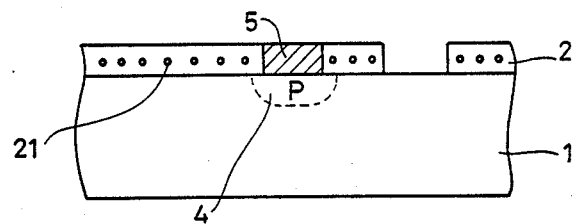

After the isolation region is thus formed, a portion of the polycrystalline silicon layer 2 serving as, for example, the channel region of the MOS transistor is removed as shown in FIG. 5G.

Figure 5H:
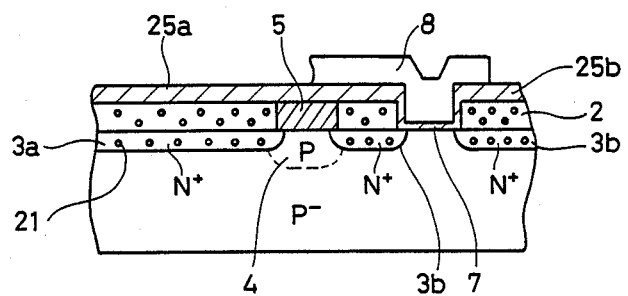

As shown in FIG. 5H, a gate oxide film 7 is grown in that portion. After interlayer insulating films 25a and 25b are formed, a gate electrode 8 is formed thereon, whereby the MOS transistor is obtained. At this time, an n type impurity 21 which has been introduced in the polycrystalline silicon layer 2 is diffused into the silicon substrate 1 by the sequential thermal treatment processes for formation of the gate oxide film 7 and the interlayer insulating films 25a and 25b. As a result, n type impurity diffused regions 3a and 3b serving as the source region and the drain region, respectively, of the MOS transistor are formed. Thus, a semiconductor apparatus having an isolation region as shown in FIG. 3B is manufactured.

Description is then made of a method of manufacturing another embodiment of a semiconductor apparatus as shown in FIG. 4. FIGS. 5I to 5M are partial sectional views showing a method of manufacturing another embodiment of a semiconductor apparatus in the order of the steps after the step as shown in FIG. 5D.

Figure 5I:
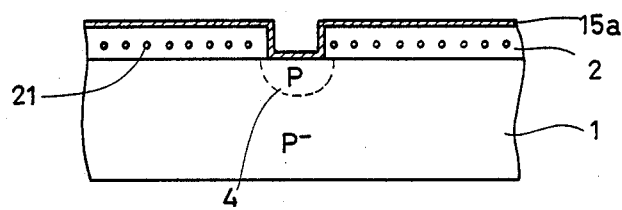

First, referring to FIG. 5I, a silicon oxide film 15a is formed by applying thermal oxidation to the whole surface.

Figure 5J:
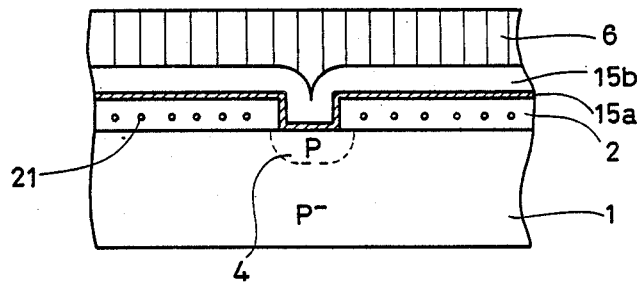

Referring to FIG. 5J, an undoped polycrystalline silicon layer 15b is deposited over the whole surface using the chemical vapor deposition method and the like. At this time, it is necessary to set a thickness of the undoped polycrystalline silicon layer 15b to a value larger than that of the polycrystalline silicon layer 2 such that the undoped polycrystalline silicon layer 15b may fill in the space between the polycrystalline silicon layer portions 2. Then, for example, a photoresist 6 is provided over the whole surface.

Figure 5K:
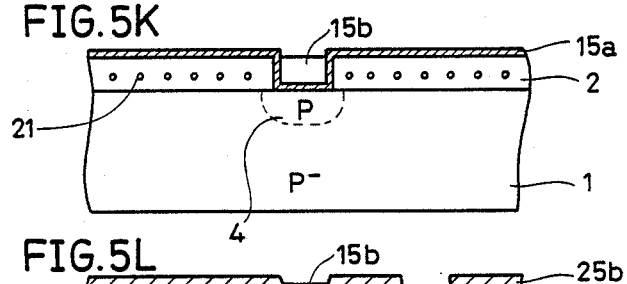

Referring to FIG. 5K, etching is made with the condition enabling an etching rate of the photoresist 6 and that of the undoped polycrystalline silicon layer 15b to be equal, until the surface of the silicon oxide film 15a is exposed. As a result, the undoped polycrystalline silicon layer 15b serving as an insulator is made flat to have an exposed surface on the same level as the surfaces of the polycrystalline silicon layer portions 2.

Figure 5L:
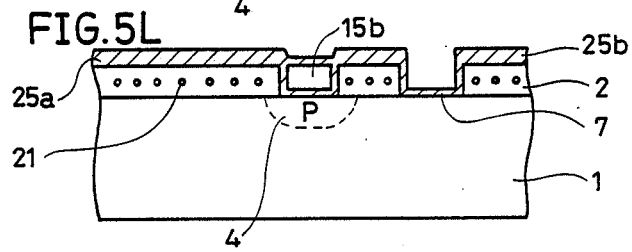

After a portion of the polycrystalline silicon layer 2 serving as, for example, the channel region of the MOS transistor is removed, a gate oxide film 7 is grown in that portion and interlayer insulating films 25a and 25b such as silicon oxide films are formed as shown in FIG. 5L. Thus, an isolation region having the channel stopper region 4 under the undoped polycrystalline silicon layer 15b surrounded by the silicon oxide film 15a is formed.

Figure 5M:
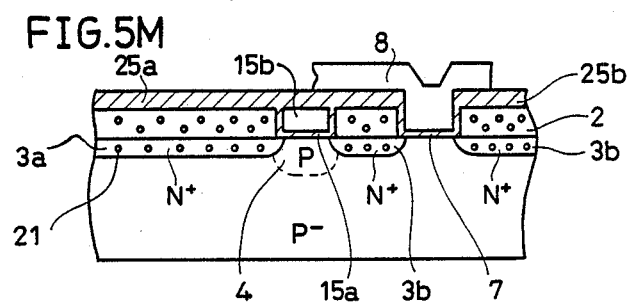

Referring to FIG. 5M, a gate electrode 8 is formed on the gate oxide film 7 and the interlayer insulating films 25a and 25b, whereby the MOS transistor is obtained as described above by referring to FIG. 5H. Thus, a semiconductor apparatus having an isolation region as shown in FIG. 4 is manufactured.

Figure 6A:
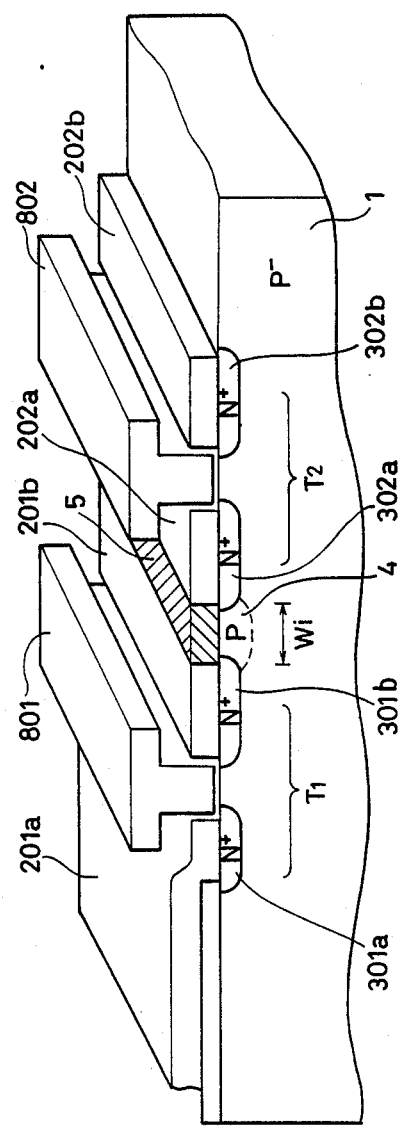
FIG. 6A is a perspective view with a cross section in part showing a semiconductor apparatus in which an MOS transistor is formed using a method for isolation between devices of the present invention.

One example of the semiconductor apparatus including an isolation region for isolating MOS transistors is shown in FIG. 6A. FIG. 6A is a perspective view with a partial cross section showing the semiconductor apparatus comprising the MOS transistors. The two MOS transistors T1 and T2 are shown as comprising source electrodes 201a and 202a and drain electrodes 201b and 202b, respectively, which are portions of the polycrystalline silicon layer 2. A gate electrode 801 is formed above the source electrode 201a and the drain electrode 201b and a gate electrode 802 is formed above the source electrode 202a and the drain electrode 202b. The impurity concentration of the channel region in the silicon substrate 1 under the gate electrode 801 and 802 is, for example, $1 \times 10^{16}/cm^3$. Source n+ regions 301a and 302a and drain n regions 301b and 302b for example, having an impurity concentration of $1 \times 10^{20}/cm^3$, are formed under the source electrodes 201a and 202a and the drain electrodes 201b and 202b, respectively. The silicon oxide film 5 is formed between the two MOS transistors T1 and T2. The channel stopper region 4, for example, having an impurity concentration of $1 \times 10^{17}$ to $3 \times 10^{17}/cm^3$, is formed under the silicon oxide film 5. In addition, an isolation width Wi of the isolation region is shown in the figure.

Figure 6B:
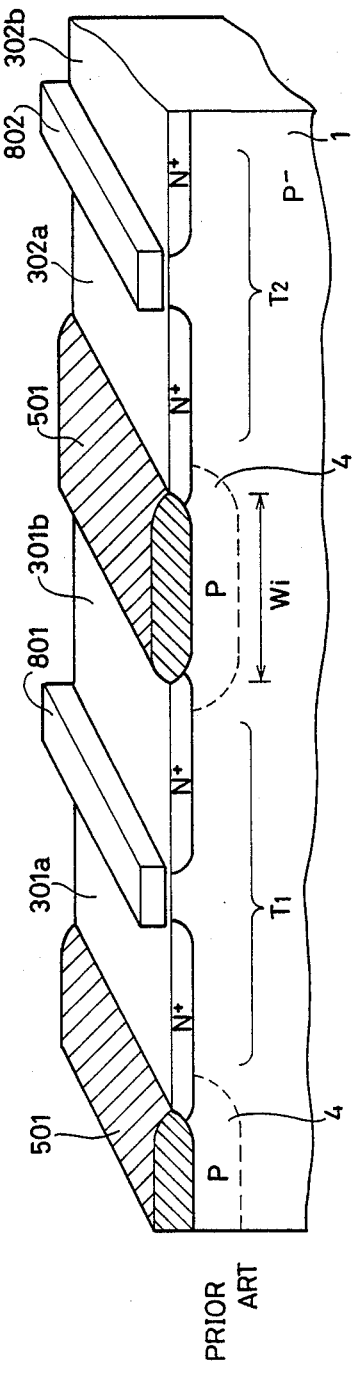
FIG. 6B is a perspective view showing a semiconductor apparatus in which a MOS transistor is formed using the conventional LOCOS isolation method.

FIG. 6B is a perspective view showing an example of a semiconductor apparatus comprising MOS transistors isolated by using the conventional LOCOS isolation method for comparison with FIG. 6A. The structure of each of the MOS transistors is the same as in the case of FIG. 6A. A region for isolation of the MOS transistors T1 and T2 is formed in a manner in which a thick field oxide film 501 and a channel stopper region 4 are formed between the MOS transistors T1 and T2.

Figure 7:
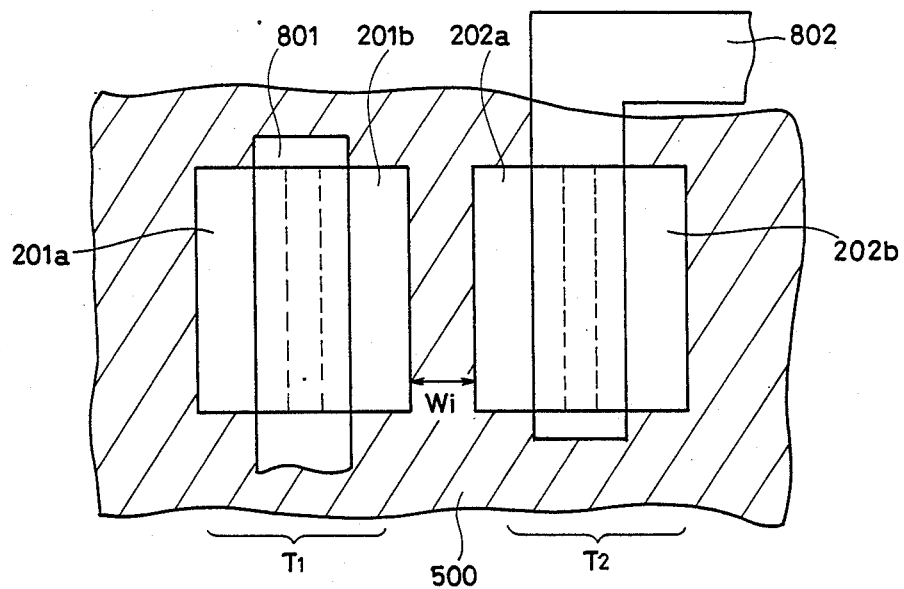
FIG. 7 is a plan view of a semiconductor apparatus formed by using the isolation method of the present invention shown in FIG. 6A.

FIG. 7 is a partial plan view showing a semiconductor apparatus comprising such MOS transistors as shown in FIG. 6A and having an isolation region formed in accordance with the present invention. The isolation region 500 is formed so as to isolate the MOS transistors T1 and T2.

Figure 8:
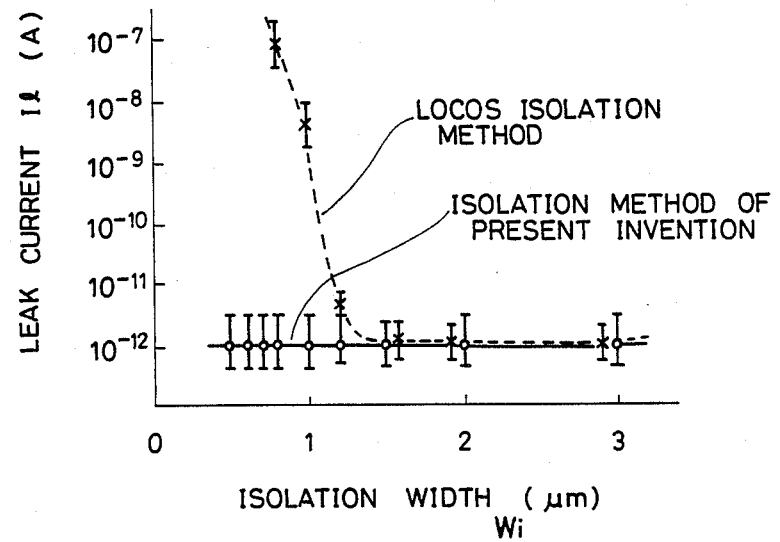
FIG. 8 is a graph showing an isolating ability of the isolation method of the present invention.

FIG. 8 is a view showing an isolating capability of the conventional LOCOS isolation method and that of the isolation method of the present invention. It is understood that the isolating capability of the isolation method of the present invention is superior to that of the conventional LOCOS isolation method in that even if the isolation width Wi becomes 1 μm or less, the leak current Il will not be increased.

Figure 9:
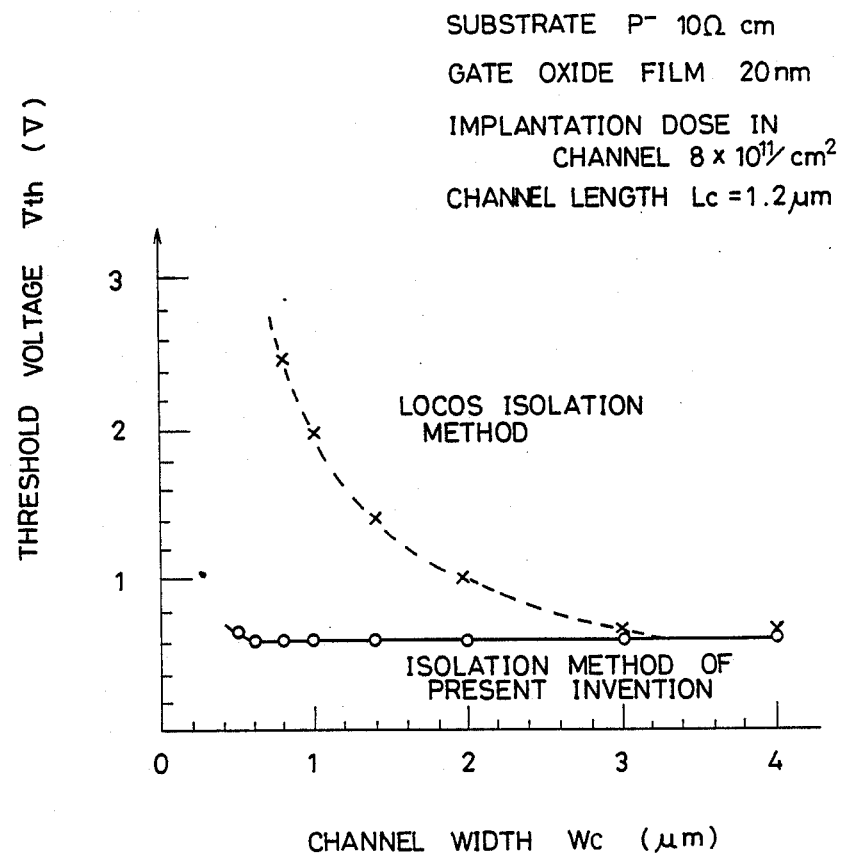
FIG. 9 is a graph showing a narrow channel effect of a MOS transistor of the conventional LOCOS isolation method and that of the isolation method of the present invention.

As described above in detail, according to the present invention as shown in FIG. 6A, there is no increase in the isolation region such as the bird's beak generated in the conventional LOCOS isolation method and it is possible to reduce the isolation width Wi to a minimum dimension permitted by the processing technique using the photolithographic and etching processes. Therefore, the isolation method of the present invention is extremely advantageous for device isolation in a semiconductor integrated circuit apparatus of a submicoron-order integration degree. In addition, the channel stopper region 4 is hardly enlarged and increase in the junction capacitance thereof with the n type impurity diffused regions 3a and 3b is suppressed because it is not necessary to apply such thermal treatment for a long time at high temperature to grow a thick field oxide film as in the LOCOS isolation method. As a result, as shown in FIG. 9, in the isolation method of the present invention, there is little narrow channel effect in which a threshold voltage Vth rises according to decrease in a channel width Wc of the MOS transistor. Furthermore, because the thermal treatment for heating the substrate to a high temperature as in the LOCOS isolation method is not necessary, the concentration of the impurity in the substrate does not change and, as a result, the channel stopper region is not necessarily required.

Since the film thickness of the silicon oxide film 5 of the isolation region is preferably reduced by etching until it is equal to the film thickness of the polycrystalline silicon layers 2a and 2b in the device isolation method of the present invention, a completely flat region can be formed as the isolation region. As a result, a difference in level which causes trouble in the conventional LOCOS isolation method can be prevented from being generated. This is convenient for formation of a fine pattern such as gate electrodes or a metal wiring. The silicon oxide film 5 needs not be flat on the same level as the polycrystalline silicon layer 2 as shown in FIG. 5F. In addition, mechanical stress caused by unequal thermal coefficients of expansion of the isolation structure is eliminated, because the thermal treatment for heating the substrate to a high temperature and the insulating material embedded in the silicon substrate are not necessary.

Figure 10:
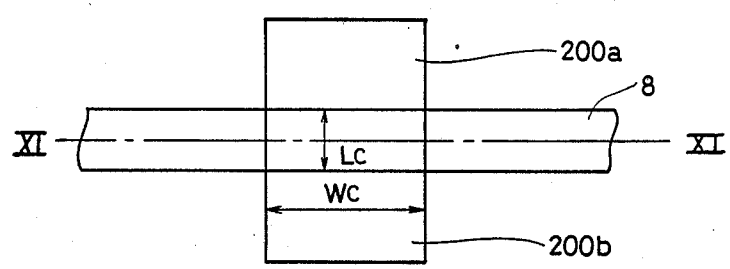
FIG. 10 is a partial plan view showing a MOS transistor.
Figure 11A:
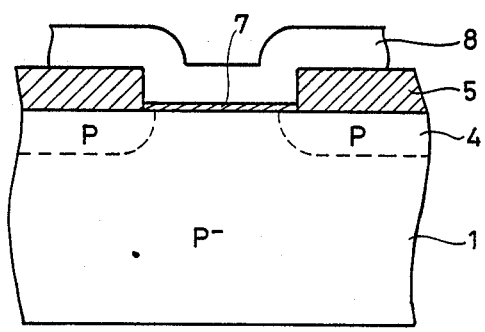
FIG. 11A is a partial sectional view showing a channel region of a MOS transistor in the case of using the isolation method of the present invention.
Figure 11B:
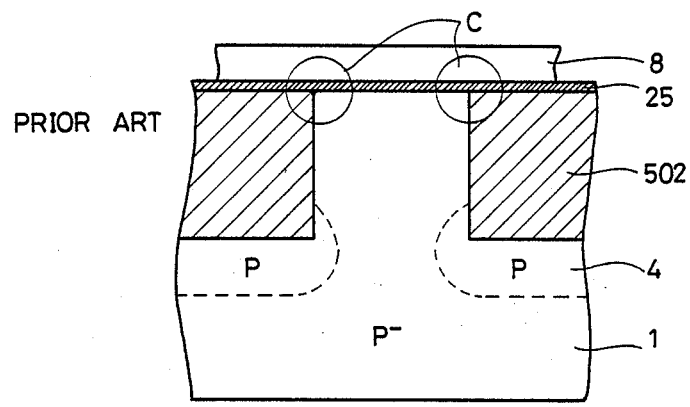
FIG. 11B is a partial sectional view showing a channel region of a MOS transistor in the case of using the conventional trench isolation method.

In accordance with the isolation method of the present invention, the leak current of the transistor which causes trouble in the conventional trench isolation method can be suppressed. FIG. 10 is a partial plan view showing a MOS transistor. Referring to the figure, a source electrode 200a and a drain electrode 200b are formed and a gate electrode 8 is formed above those. Reference character Lc denotes a channel length and reference character Wc denotes a channel width. FIGS. 11A and 11B are sectional views vertically taken along the direction in which carriers flow in the channel of the MOS transistor, that is, taken along the line XI—XI in FIG. 10. FIG. 11A shows a case in which the isolation method of the present invention is used and FIG. 11B shows a case in which the conventional trench isolation method is used. For the trench isolation in FIG. 11B, it is difficult to dope the side wall portion of the trench with a p type impurity to form the channel stopper regions 4 thereon. In addition, concentration of an electrode field occurs in the corner portions of the channel edge shown as C and a threshold voltage is liable to be lowered. As a result, a leak current which cannot be controlled by the gate voltage is generated. Meanwhile, for the isolation method of the present invention as shown in FIG. 11A, the p type channel stopper region 4 is formed adjacent to the channel region (originally the region on which the polycrystalline silicon layer 2 existed). Since the gate electrode 8 is formed through the thick oxide film 5 for isolation at the channel ends, the threshold voltage is slightly raised and, as a result, the generation of the leak current can be completely prevented.

In the above described embodiment, although the silicon oxide film deposited by the chemical vapor deposition method is used as an insulating layer, it may be a silicon oxide film formed by a thermal oxidation method or a composite film formed by combining a silicon oxide film by the thermal oxidation method and the silicon oxide film by the chemical vapor deposition method. If such a composite film, namely, a silicon oxide film containing a polycrystalline silicon layer, or another composite film such as the one including a silicon oxide film and a nitride film is employed, a same effect as in the above described embodiment can be achieved.

Although the above described embodiment was described as employing the n channel MOS transistors, it s needless to say that the same effect can be provided as the above described embodiment by appropriately selecting the polarity of the conductivity type even if they are p channel MOS transistors or complementary MOS transistor.

Figure 12:
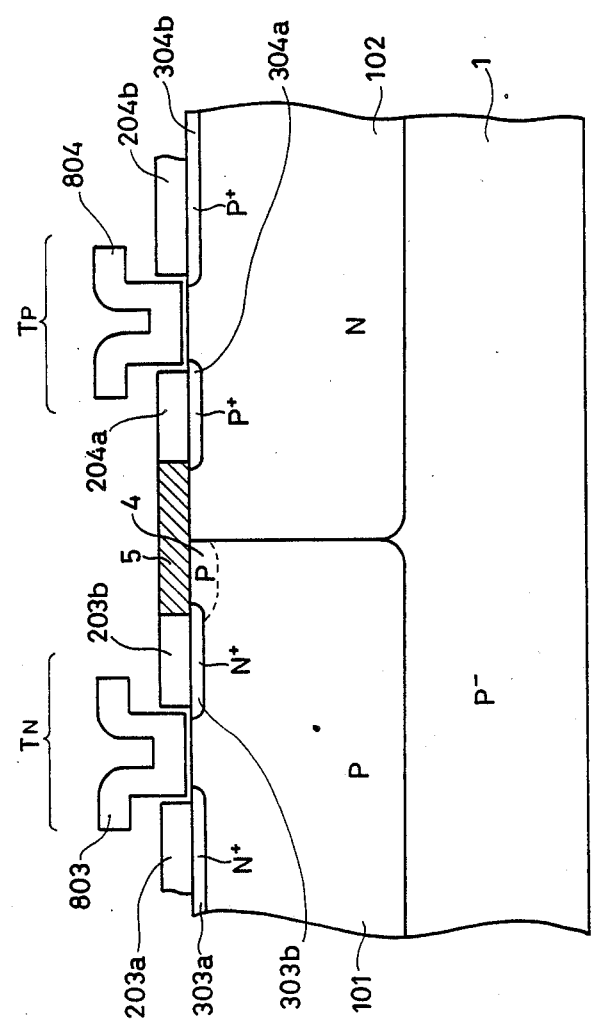
FIG. 12 is a partial sectional view showing a case in which the isolation method of the present invention is applied to a complementary MOS transistor.

FIG. 12 is a partial sectional view showing a case in which the device isolation method of the present invention is used in complementary MOS transistors. Referring to the figure, a p channel MOS transistor $T_P$ and an n channel MOS transistor $T_N$ are formed. The n channel MOS transistor $T_N$ comprises a source electrode 203a, a drain electrode 203b and a gate electrode 803 formed above those electrodes. A source N+ region 303a and a drain N+ region 303b are formed under the source electrode 203a and the drain electrode 203b, respectively. These impurity diffused regions 303a and 303b are formed in a p type well layer 101. On the other hand, the p channel MOS transistor $T_P$ comprises a source electrode 204a, a drain electrode 204b and a gate electrode 804 formed above those electrodes. A source P+ region 304a and a drain P+ region 304b are formed under the source electrode 204a and the drain electrode 204b, respectively. These impurity diffused regions 304a and 304b are formed in an n type well layer 102. The p type well layer 101 and the n type well layer 102 are formed in the silicon substrate 1. The silicon oxide film 5 is provided to fill in a space between the drain electrode 203b and the source electrode 204a in order to isolate the p channel MOS transistor $T_P$ and the n channel MOS transistor $T_N$. In this example, the channel stopper region 4 is formed as a p type region under the silicon oxide film 5 in the p type well layer 101. This channel stopper region 4 may be formed as an n type region in the n type well layer 102. The channel stopper region 4 is not necessarily formed depending on the p type impurity concentration of the p type well layer 101 or the n type impurity concentration of the n type well layer 102.

As described above, a region for isolation between devices in accordance with the present invention is of a structure in which a semiconductor region of a conductivity type opposite to that of the semiconductor substrate is formed under a polycrystalline silicon layer and an insulating layer fills in a space provided by patterning of the polycrystalline silicon layer. Therefore, it becomes possible to form very small regions for isolation between devices. Thus, a semiconductor apparatus of a very small size having excellent electrical characteristics can be manufactured at high yield and at low cost.

The isolation structure described here is applicable to divide variety of circuits although most suited to high density IC such as high density memory. In this case, it is possible to combine the isolation structure described herein within cell array region of the memory having a high integrated density, with a conventional isolation such as LOCOS isolation within peripheral regions of the memory having a low integrated density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor apparatus having a region for isolation between devices comprising:
   a semiconductor substrate having a main surface and having a predetermined impurity concentration of a certain conductivity type;
   portions of a polycrystalline silicon layer selectively formed spaced apart rom each other on the main surface of said semiconductor substrate;
   a semiconductor region of the inverse conductivity type from that of said semiconductor substrate, formed in said semiconductor substrate under said polycrystalline silicon layer; and
   an insulating layer including an oxide film formed on said main surface of said semiconductor substrate to fill in a portion in which the main surface of said semiconductor substrate is exposed between adjacent portions of said polycrystalline silicon layer spaced from each other, whereby said semiconductor region is isolated by said insulating layer oxide film.

2. A semiconductor apparatus having a region for isolation between devices in accordance with claim 1, wherein said insulating layer oxide film is a silicon oxide film.

3. A semiconductor apparatus having a region for isolation between devices in accordance with claim 1, wherein said semiconductor apparatus comprises a plurality of semiconductor devices isolated from each other by said insulating layer on the main surface of said semiconductor substrate.

4. A semiconductor apparatus having a region for isolation between devices in accordance with claim 3, wherein each of said semiconductor devices comprises said semiconductor region.

5. A semiconductor apparatus having a region for isolation between devices in accordance with claim 4, wherein said semiconductor region constitutes one portion of a field effect device.

6. A semiconductor apparatus having a region for isolation between devices in accordance with claim 5, wherein said field effect device comprises a complementary MOS transistor.

7. A semiconductor apparatus having a region for isolation between devices in accordance with claim 5 wherein said field effect device comprises a MOS transistor.

8. A semiconductor apparatus having a region for isolation between devices in accordance with claim 5, wherein said field effect device comprises an insulated gate, a first electrode and a second electrode formed spaced apart from each other under said insulating gate on the main surface of said semiconductor substrate, said semiconductor region constituting any of said first electrode and said second electrode, a channel region being formed on said semiconductor substrate between said first and second electrodes.

9. A semiconductor apparatus having a region for isolation between devices in accordance with claim 8, wherein at least either said first electrode or said second electrode is joined to said polycrystalline silicon layer.

10. A semiconductor apparatus having a region for isolation between devices in accordance with claim 9, wherein an inversion preventing region for preventing inversion of conductivity types is formed in a region of said semiconductor substrate under said insulating layer.

11. A semiconductor apparatus having a region for isolation between devices in accordance with claim 10, wherein said inversion preventing region has the same conductivity type as that of said semiconductor substrate and has an impurity concentration higher than that of said semiconductor substrate.

12. A semiconductor apparatus having a region for isolation between devices comprising:
a semiconductor substrate having a main surface and having a predetermined impurity concentration of a certain conductivity type;
portions of a polycrystalline silicon layer selectively formed spaced apart from each other on the main surface of said semiconductor substrate;
a semiconductor region of the inverse conductivity type from that of said semiconductor substrate, formed under said polycrystalline silicon layer; and
an insulating layer to fill in a portion in which the main surface of said semiconductor substrate is exposed between adjacent portions of said polycrystalline silicon layer spaced from each other, whereby said semiconductor region is isolated by said insulating layer, said insulating layer comprising a silicon oxide film containing undoped polycrystalline silicon therein.

13. A semiconductor apparatus having a region for isolation between devices in accordance with claim 12, wherein said semiconductor apparatus comprises a plurality of semiconductor devices isolated from each other by said insulating layer on the main surface of said semiconductor substrate.

14. A semiconductor apparatus having a region for isolation between devices in accordance with claim 13, wherein each of said semiconductor devices comprises said semiconductor region.

15. A semiconductor apparatus having a region for isolation between devices in accordance with claim 14, wherein said semiconductor region constitutes one portion of a field effect device.

16. A semiconductor apparatus having a region for isolation between devices in accordance with claim 15, wherein said field effect device comprises a complementary MOS transistor.

17. A semiconductor apparatus having a region for isolation between devices in accordance with claim 15, wherein said field effect device comprises a MOS transistor.

18. A semiconductor apparatus having a region for isolation between devices in accordance with claim 15, wherein said field effect device comprises an insulated gate, a first electrode and a second electrode formed spaced apart from each other under said insulating ate on the main surface of said semiconductor substrate, said semiconductor region constituting any of said first electrode and said second electrode, a channel region being formed on said semiconductor substrate between said first and second electrodes.

19. A semiconductor apparatus having a region for isolation between devices in accordance with claim 18, wherein at least either said first electrode or said second electrode is joined to said polycrystalline silicon layer.

20. A semiconductor apparatus having a region for isolation between devices in accordance with claim 19, wherein an inversion preventing region for preventing inversion of conductivity types is formed in a region of said semiconductor substrate under said insulating layer.

21. A semiconductor apparatus having a region for isolation between devices in accordance with claim 20, wherein said inversion preventing region has the same conductivity type as that of said semiconductor substrate and has an impurity concentration higher than that of said semiconductor substrate.

22. A semiconductor apparatus having a region for isolation between devices comprising:
a semiconductor substrate having a main surface and having a predetermined impurity concentration of a certain conductivity type;
portions of a polycrystalline silicon layer selectively formed spaced apart from each other on the main surface of said semiconductor substrate;
a semiconductor region of the inverse conductivity type from that of said semiconductor substrate, formed under said polycrystalline silicon layer; and
an insulating layer including an oxide film to fill in a portion in which the main surface of said semiconductor substrate is exposed between adjacent portions of said polycrystalline silicon layer spaced from each other, whereby said semiconductor region is isolated by said insulating layer, said insulating layer has an upper surface substantially coplanar with an upper surface of said polycrystalline silicon layer.

23. A semiconductor apparatus having a region for isolation between devices in accordance with claim 22, wherein said insulating layer comprises at least a silicon oxide film 24. A semiconductor apparatus having a region for isolation between devices in accordance with claim 22, wherein said semiconductor apparatus comprises a plurality of semiconductor devices isolated from each other by said insulating layer on the main surface of said semiconductor substrate.

25. A semiconductor apparatus having a region for isolation between devices in accordance with claim 24, wherein each of said semiconductor devices comprises said semiconductor region.

26. A semiconductor apparatus having a region for isolation between devices in accordance with claim 25, wherein said semiconductor region constitutes one portion of a field effect.

27. A semiconductor apparatus having a region for isolation between devices in accordance with claim 26, wherein said field effect device comprises a MOS transistor.

28. A semiconductor apparatus having a region for isolation between devices in accordance with claim 26, wherein said field effect device comprises a complementary MOS transistor.

29. A semiconductor apparatus having a region for isolation between devices in accordance with claim 26, wherein said field effect device comprises an insulated gate, a first electrode and a second electrode formed spaced apart from each other under said insulating gate on the main surface of said semiconductor substrate, said semiconductor region constituting any of said first electrode and said second electrode, a channel region being formed on said semiconductor substrate between said first and second electrodes.

30. A semiconductor apparatus having a region for isolation between devices in accordance with claim 29, wherein at least either said first electrode or said second electrode is joined to said polycrystalline silicon layer.

31. A semiconductor apparatus having a region for isolation between devices in accordance with claim 30, wherein an inversion preventing region for preventing inversion of conductivity types is formed in a region of said semiconductor substrate under said insulating layer.

32. A semiconductor apparatus having a region for isolation between devices in accordance with claim 31, wherein said inversion preventing region has the same conductivity type as that of said semiconductor substrate and has an impurity concentration higher than that of said semiconductor substrate.

33. A semiconductor apparatus having a region for isolation between devices comprising:
  a semiconductor substrate having a main surface and having a predetermined impurity concentration of a certain conductivity type;
  portions of a polycrystalline silicon layer selectively formed spaced apart from each other on the main surface of said semiconductor substrate;
  a semiconductor region of the inverse conductivity type from that of said semiconductor substrate, formed under said polycrystalline silicon layer; and
  an insulating layer to fill in a portion in which the main surface of said semiconductor substrate is exposed between adjacent portions of said polycrystalline silicon layer spaced from each other, whereby said semiconductor region is isolated by said insulating layer, said insulating layer has an upper surface substantially coplanar with an upper surface of said polycrystalline silicon layer, said insulating layer including a silicon oxide film of undoped polycrystalline silicon.

* * * * *